July 7, 1970 I. G. AKMENKALNS 3,519,844

ELECTRO-OPTICAL LOGIC CIRCUITS PERFORMING NOR FUNCTIONS

Filed Dec. 23, 1966 2 Sheets-Sheet 1

INVENTOR
IVARS G. AKMENKALNS

BY [signature]
AGENT

ELECTRO-OPTICAL LOGIC CIRCUITS PERFORMING NOR FUNCTIONS

Filed Dec. 23, 1966

United States Patent Office 3,519,844
Patented July 7, 1970

3,519,844
ELECTRO-OPTICAL LOGIC CIRCUITS PERFORMING NOR FUNCTIONS

Ivars G. Akmenkalns, Endwell, N.Y., assignor to International Business Machines Corporation, Armonk, N.Y., a corporation of New York Filed Dec. 23, 1966, Ser. No. 604,271
Int. Cl. H03k 19/10
U.S. Cl. 307—206 3 Claims

ABSTRACT OF THE DISCLOSURE

Logic circuits employing different arrangements of tunnel diodes and light emitting diodes under control of light responsive diodes are utilized to perform the logical NOR function.

Figure 1:
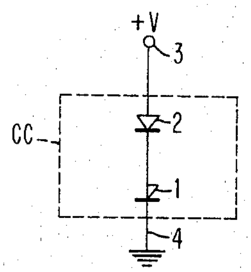

The invention relates to diode logic circuits and more particularly to tunnel diode logic circuits having electro-optical switching controls.

High speed logic switching circuits have been utilized for a variety of logical functions in computers of the prior art. Although computer packaging techniques have advanced significantly, extended use or application of these switching circuits has not kept pace with other technological advances in the computer art. This is primarily due to intercoupling mode by which electrical conductors, and the like, are utilized to establish connections between the various logic circuits.

The present invention, however, broadens the application by utilizing electromagnetic radiations as the media for intercoupling the various logical configurations. A convenient form of such radiation may be light which needs no mechanical device for its transmission within the limited confines surrounding the novel switching circuits.

An object of the invention is in the novel configuration of logical devices which are coupled by electromagnetic radiations enabling higher volumetric efficiency to be realized in computer packaging.

Another object is to provide novel logical configurations employing non-linear components with electro-optical coupling to provide high speed logical functions with a high degree of reliability.

A more specific object is to provide highly reliable and economical cell configurations comprising tunnel diodes and light emitting diodes interconnected with light responsive devices employing electro-optical coupling to provide the various logical functions in the computer.

The foregoing and other objects, features and advantages of the invention will be apparent from the following more particular description of preferred embodiments of the invention, as illustrated in the accompanying drawings.

In the drawings:

FIG. 1 shows a basic logical cell constituted of a tunnel diode and a light emitting diode.

Figure 2A:
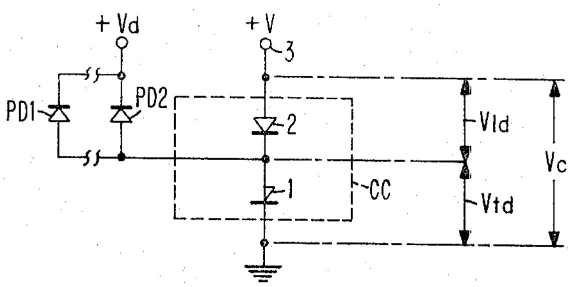

FIG. 2*a* is a configuration employing the cell of FIG. 1 coupled to light responsive diodes to provide a logical NOR function.

Figure 2B:
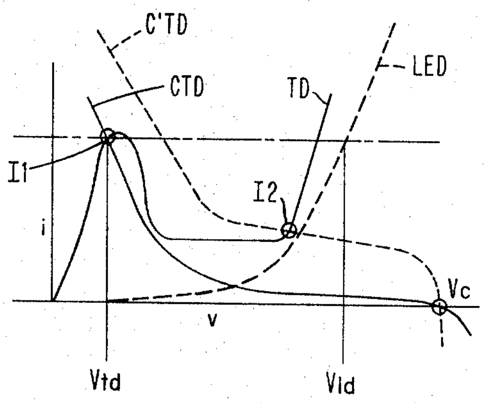

FIG. 2*b* shows various operating curves for the components utilized in the configuration of FIG. 2*a*.

Figure 3A:
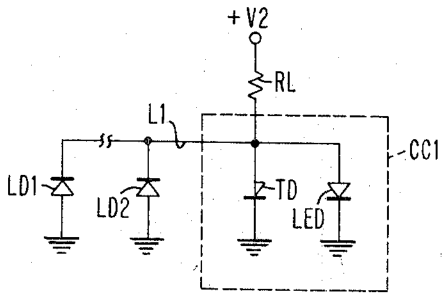

FIG. 3*a* shows another configuration providing a logical NOR function.

Figure 3B:
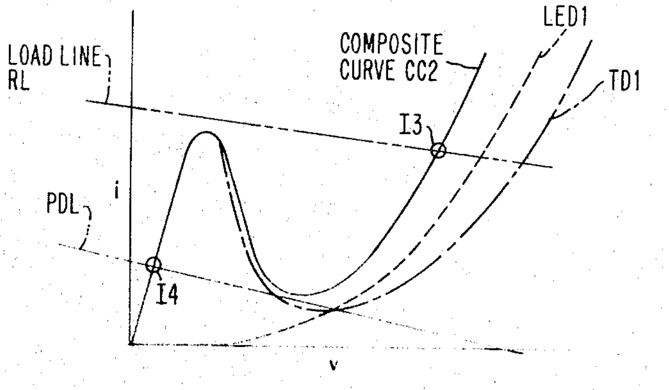

FIG. 3*b* shows supporting curves for the components utilized in the NOR configuration of FIG. 3*a*.

Figure 4:
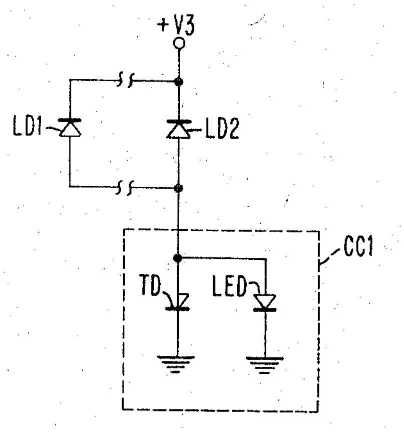

FIG. 4 shows a configuration which can be utilized as a positive OR or as a positive AND function.

Figure 5A:
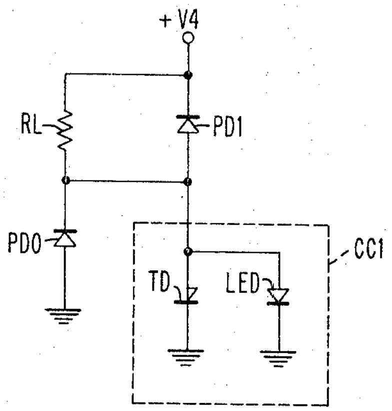

FIG. 5*a* shows a binary latch configuration.

Figure 5B:
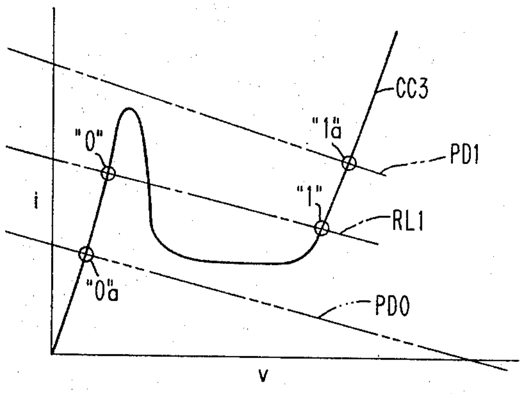

FIG. 5*b* shows supporting curves for the binary latch configuration of FIG. 5*a*.

Figure 6:
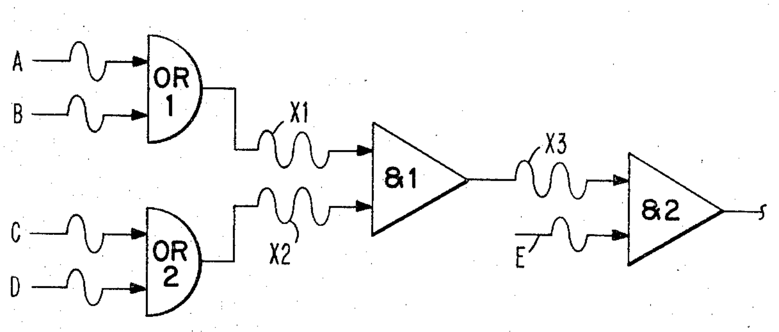

FIG. 6 shows schematically the electro-optical intercoupling of logical configurations.

Referring to FIG. 1, a configuration of a basic cell CC is shown constituted of a non-linear device 1, such as a tunnel diode, directly connected in series with a light emitting diode 2, also a non-linear device. A power supply 3 is connected to the anode portion of the light emitting diode 2 and the ground connection 4 is made to the cathode of the tunnel diode 1. In the case of the present invention wherein GaAs devices are employed, a power supply of about 1.3 volts is adequate to provide the tunnel diode 1 with a stable bias point which is considered a low voltage state, while the light emitting diode 2 assumes a relatively high voltage state. In the high voltage state the light emitting diode emits light, whereas in the low voltage state, it does not emit light. The relative position of the bias point will be more fully explained in an analysis of the configuration of FIG. 2*a* to which reference is now invited. In FIG. 2*a* the logical configuration utilizes the cell of FIG. 1 in which are shown the light emitting diode 2 connected in series with the tunnel diode 1, the cell configuration being connected to a power supply of +1.3 volts and the tunnel diode in turn being connected to ground. This cell configuration in turn is connected to at least two or more light responsive photo diodes PD1, PD2 to provide the logical NOR function.

In the diagram of FIG. 2*b* there are shown the current voltage curves TD and LED respectively, for the tunnel diode 1 and the light emitting diode LED 2. In accordance with Kirchhoff's law, the voltage $V_c$ across the cell configuration in FIG. 2*a* represents the sum of the voltages $V_{td}$ and $V_{ld}$ respectively, across the tunnel diode and the light emitting diode for a given value of current flow through the cell CC. This condition of voltage and current yields a single stable bias point $I_1$ shown in FIG. 2*b* at the intersection of load line CTD and the curve TD. This point is thus determined in accordance with Kirchhoff's current law which, in this instance, states that the current through the tunnel diode 1 should be equal to the current through the light emitting diode 2. From a further inspection of FIG. 2*b* it is seen that the voltages corresponding to these equal values of current flow through both diodes 1 and 2 are indicated at $V_{td}$ and $V_{ld}$ respectively; and the point $V_c$ representing the sum of these two voltages, is shown as the point where the load line CTD intersects the horizontal voltage axis and represents the power supply in FIG. 2*a*.

The presence of the photo diodes PD1 and PD2 and the voltage supply $V_d$ in the configuration of FIG. 2*a* and the activation of these diodes by the influence of light causes the latter to inject additional current flow through the tunnel diode 1. The effect of this additional current flow is to raise the load line for the tunnel diode to that indicated by the dotted curved line C'TD, thereby providing a new bias point for the tunnel diode. The new bias point $I_2$ is shown in the diagram where the load line C'TS intersects the tunnel diode curve TD, the bias point representing the second state of the NOR configuration.

In summary, the absence of light on the photo diodes provides the NOR configuration with a first state in which the tunnel diode assumes a low voltage, and a second state when the photo diodes, either singly or in combination, are influenced by incident light to provide the tunnel diode with a high voltage.

Reasonably good efficiency from the basic cell configuration has been obtained by utilizing GaAs tunnel diodes and light emitting diodes in a low temperature environment. A minimum gain of twelve for the current gain between the photo diodes and the light emitting diode yields a light power gain of about three. Although the tunnel diode and the light emitting diode should preferably be of the same type, the photo diodes, on the other hand, may be constituted of germanium, silicon or compounds thereof, the latter being available in types PN or type P-i-N and suitable for operation at elevated temperatures. To accommodate photo diodes and tunnel diodes having different gain characteristics, the voltage $V_d$ for the photo diodes should be equal to or greater than the voltage $V_3$ connected to the basic cell configuration.

Another configuration in which the NOR function can be implemented is shown in FIG. 3*a*, with supporting curves being shown in FIG. 3*b*. The basic cell configuration in FIG. 3*a* shows the tunnel diode TD and the light emitting diode LED connected in parallel between ground and a load resistor RL in turn connected to a positive power supply $V_2$. At least a pair of light responsive diodes LD1 and LD2 are connected in parallel to the cell configuration CC1 by way of line L1.

In the analysis of the NOR configuration, reference is invited to FIG. 3*b* which shows curves LED1 and TD1 respectively for the tunnel diode TD and the light emitting diode when the latter are connected in the configuration of CC1 but directly to the power supply $V_2$, with the load resistor RL being by-passed for the moment. For just the basic cell configuration the composite curve CC2 reflects the characteristic of the tunnel diode. The introdction of the load resistor RL between the cell configuration CC1 and the power supply $V_2$ provides a stable bias point $I_3$ which is the point at which the load line RL intercepts the composite curve CC1. This bias point represents the ON state of the tunnel diode at which the tunnel diode assumes a high voltage high current state with the light emitting diode being activated to emit light.

By adding the photo diodes PD1 and PD2 to form the complete configuration of FIG. 3*a*, and by influencing the photo diodes with light, the load line is shifted to the position indicated by the line PDL to provide a new stable bias point $I_4$ formed at the intersection of the load line PDL and the curve CC2. This point $I_4$ represents the OFF state of the NOR configuration in which the tunnel diode is at a low voltage and the light emitting diode is deacitivated.

The configuration of FIG. 4 is utilized to implement an OR function or an AND function. The configuration utilizes the basic cell CC1 connected in series with a pair of light responsive diodes LD1 and LD2 in turn connected to a positive voltage source $V_3$. In this configuration the stable bias points are similar to the bias points $I_3$ and $I_4$ described in connection with FIG. 3*b* and representing respectively the ON and OFF states of the tunnel diode and the light emitting diode.

Under rigidly controlled conditions of light intensity and voltage, the configuration of FIG. 4 may be utilized to implement the AND function. This is achieved by using light with approximately one half of the light intensity used to influence the light responsive diodes in the OR configuration.

The configuration of FIG. 5*a* is used to implement a binary latch which shows the cell CC1 connected to light responsive diodes PD0 and PD1 with the latter being directly connected to the power supply $V_4$ while the diode PD0 is indirectly connected to the supply $V_4$ by way of a resistor RL, and all diodes with the exception of diode PD1, being connected to ground.

In FIG. 5*a* the composite current voltage curve for the tunnel diode is shown as CC3, which is intersected by three load lines, PD1, RL1, and PD0, forming intersecting bias points, "0," "1*a*," "1," and "0*a*." The bias point "0" shows the stable point for the latch when the latter is in its OFF state. As a convenience in explaining the operation of the latch, "dark" state and "light" state for the light responsive diodes, signify respectively the absence and presence of an incident light signal on the light responsive diodes PD0 and PD1.

Initially with the diodes PD0 and PD1 in their "dark" state position of the load line RL1 provides a single stable bias point "0" at which point no light is emitted by the diode LED. In this state the latch is considered to be OFF. When the light signal is applied to diode PD1 the latter injects additional current through the tunnel diode to provide a shift in the load line to the position PD1 in FIG. 5*b*. The intersection of load line PD1 with the curve CC3 yields the bias point 1*a*. At the expiration of the light signal on diode PD1 the load line shifts back to the position RL1 and the tunnel diode thereupon relaxes to the point "1" at which the tunnel diode assumes its high voltage state thereby placing the latch in its ON state with both diodes PD0 and PD1 assuming "dark" states. When the diode PD0 is placed in its "light" state under the influence of an appropriate light pulse, the load line is shifted to the position PD0 to yield the bias point "0" which is shown at the intersection of load line PD0 and curve CC3. At the expiration of the light pulse the load light shifts back to the position RL1 and the tunnel diode relaxes to its low voltage state indicated by the point "0" and thereby representing the OFF state of the latch.

As a sample of how the various logical configurations can be utilized in a computer for performing the various logical functions, consider the schematic representations shown in FIG. 6 wherein are shown the various OR and AND configurations optically interconnected by way of light pulses. An input light pulse is shown as a sine wave connected to an arrow. For example X1, X2 and X3. Two OR devices, OR 1 and OR 2 are shown influenced by input light pulses A, B, C, D, to provide output light pulses X1, X2. The latter are applied as inputs to a logical configuration AND 1 to provide an output light pulse X3. The latter in combination with an input light pulse E serve as inputs to the logical configuraiton AND 2.

The optical coupling interconnecting the various logical configurations in FIG. 6 requires no electrical connections whatsoever and depending upon the proximity of adjacent cell configurations, optical fiber, or the like, may or may not be necessary to transmit the output light signals from one logical configuration to inputs of neighboring configurations.

In the case where spontaneous emission PN diodes are used, appropriate means are utilized to obtain a directional control of the emitted light. Where PN injection laser types are used, the emitted light is directional and under this condition directional control may or may not be required.

The photo responsive devices employed in the various configurations of the invention may be of the PN, P-i-N, or the avalanche multiplication type, the latter providing additional gain in the various circuit configurations.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A logical NOR circuit comprising:
- a tunnel diode,
- a light emitting diode connected in parallel with said tunnel diode,
- a source of voltage havig positive and ground terminals including connctions for connecting the anodes of said diodes to the positive terminal and the cathodes of said diodes to the ground terminal, and
- at least a pair of light responsive cells connected in parallel with respect to each other, and in parallel with said diodes to provide a logical NOR function.

2. The NOR circuit as in claim 1 further including a load interposed between the tunnel diode and the positive terminal.

3. The NOR circuit as in claim 2 in which said load comprises a load resistor and a light responsive diode connected in parallel therewith, and a second light responsive diode connected in parallel with said tunnel diode to provide a latch configuration.

References Cited

UNITED STATES PATENTS 3,319,080 5/1967 Cornely et al. ---- 307—206 X

JOHN S. HEYMAN, Primary Examiner

H. A. DIXON, Assistant Examiner

U.S. Cl. X.R.

307—215, 311, 322